United States Patent
Valdez et al.

(10) Patent No.: US 8,319,466 B2
(45) Date of Patent: Nov. 27, 2012

(54) MODULAR LINE-TO-GROUND FAULT IDENTIFICATION

(75) Inventors: Carlos Rodriguez Valdez, Glendale, WI (US); Russel J. Kerkman, Milwaukee, WI (US); Rangarajan Tallam, Germantown, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 96 days.

(21) Appl. No.: 13/031,454

(22) Filed: Feb. 21, 2011

(65) Prior Publication Data

US 2012/0212172 A1   Aug. 23, 2012

(51) Int. Cl.
*H02H 3/16* (2006.01)
*H02H 7/08* (2006.01)

(52) U.S. Cl. .................. 318/434; 361/42; 361/47
(58) Field of Classification Search .......... 318/434, 318/490; 361/18, 23, 30, 31, 33, 42, 44, 361/47; 363/50

See application file for complete search history.

(56) References Cited

U.S. PATENT DOCUMENTS

| | | | |
|---|---|---|---|
| 4,130,892 A | 12/1978 | Gunckel, II et al. | |
| 4,247,791 A | 1/1981 | Rovell | |
| 4,500,841 A | 2/1985 | Morey | |
| 4,764,956 A * | 8/1988 | Rosch et al. | 379/413 |
| 5,490,030 A * | 2/1996 | Taylor et al. | 361/45 |
| 5,614,864 A | 3/1997 | Stubbe et al. | |
| 6,417,793 B1 | 7/2002 | Bugeja et al. | |
| 6,617,814 B1 | 9/2003 | Wu et al. | |
| 6,842,354 B1 | 1/2005 | Tallam et al. | |
| 6,867,564 B1 | 3/2005 | Wu et al. | |
| 6,987,372 B1 | 1/2006 | Wu et al. | |
| 7,106,025 B1 | 9/2006 | Yin et al. | |
| 7,132,812 B1 | 11/2006 | Wu et al. | |
| 7,164,254 B2 | 1/2007 | Kerkman et al. | |
| 7,215,559 B2 | 5/2007 | Nondahl et al. | |
| 7,274,576 B1 | 9/2007 | Zargari et al. | |
| 7,342,380 B1 | 3/2008 | Kerkman et al. | |
| 7,400,518 B2 | 7/2008 | Yin et al. | |
| 7,649,756 B2 | 1/2010 | Kerkman et al. | |
| 7,724,549 B2 | 5/2010 | Skibinski et al. | |
| 7,738,267 B1 | 6/2010 | Tallam et al. | |
| 7,825,621 B2 | 11/2010 | Wei et al. | |
| 7,848,122 B2 | 12/2010 | Tallam et al. | |
| 7,881,081 B1 | 2/2011 | Tallam et al. | |
| 7,894,169 B2 * | 2/2011 | Valdez et al. | 361/47 |

* cited by examiner

*Primary Examiner* — Bentsu Ro
(74) *Attorney, Agent, or Firm* — Fletcher Yoder P.C.; Alex R. Kuszewski; John M. Miller

(57) ABSTRACT

The present invention relates generally to systems and methods for detecting ground faults (i.e., line-to-ground faults) in electrical power conversion systems. In particular, the embodiments described herein include a common mode voltage booster module configured to calculate a common mode voltage boost factor and a common mode voltage boost function based on a plurality of voltage commands for the system. The common mode voltage boost factor and/or the common mode voltage boost function may be applied to the voltage commands to generate boosted voltage commands which, when applied to an inverter or converter, source current indicative of ground faults in the system. More specifically, the common mode voltage boost factor may be multiplied by a common mode voltage calculated by a common mode voltage calculator and summed with the voltage commands. In addition, the common mode voltage boost function may be summed with the voltage commands after the voltage commands have been summed with the common mode voltage boost factor.

23 Claims, 4 Drawing Sheets

MODULAR LINE-TO-GROUND FAULT IDENTIFICATION

BACKGROUND

The invention relates generally to sensing ground faults in electrical equipment, such as motor drives. Particularly, this invention relates to modular line-to-ground fault identification techniques.

Many electrical devices, such as motor drives, often include converter circuitry for converting incoming AC power into DC power, and inverter circuitry for converting the DC power into controlled frequency AC power output. Output currents for three phases of the AC power may be sensed for monitoring and control functions, such as for motor control and protection. For example, a ground current may be determined by summing all three measured phase currents. When the sum of the three phase currents exceeds a threshold value (e.g., 20% of the rated current for the motor drive), a ground fault of the system may be considered to have occurred. Often, ground fault detection samples the sum of the three phase currents, filters the result, and generates an alarm when the threshold value is exceeded. The threshold value may be adjustable to low levels, but this method of ground fault detection is still somewhat sensitive to noise and feedback accuracy. Furthermore, the ratio between the fault current and the nominal current of the motor might be comparable to the signal-to-noise ratio of the current sensor used and, thus, the system may not detect a ground fault when it perhaps should. Therefore, there is a need for more reliable detection of ground faults.

BRIEF DESCRIPTION

The present invention relates generally to systems and methods for detecting ground faults (i.e., line-to-ground faults) in electrical power conversion systems. In particular, the embodiments described herein include a common mode voltage booster module configured to calculate a common mode voltage boost factor and a common mode voltage boost function based on a plurality of voltage commands for the system. The common mode voltage boost factor and/or the common mode voltage boost function may be applied to the voltage commands to generate boosted voltage commands which, when applied to an inverter or converter, source current indicative of ground faults in the system. More specifically, the common mode voltage boost factor may be multiplied by a common mode voltage calculated by a common mode voltage calculator and summed with the voltage commands. In addition, the common mode voltage boost function may be summed with the voltage commands after the voltage commands have been summed with the common mode voltage boost factor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
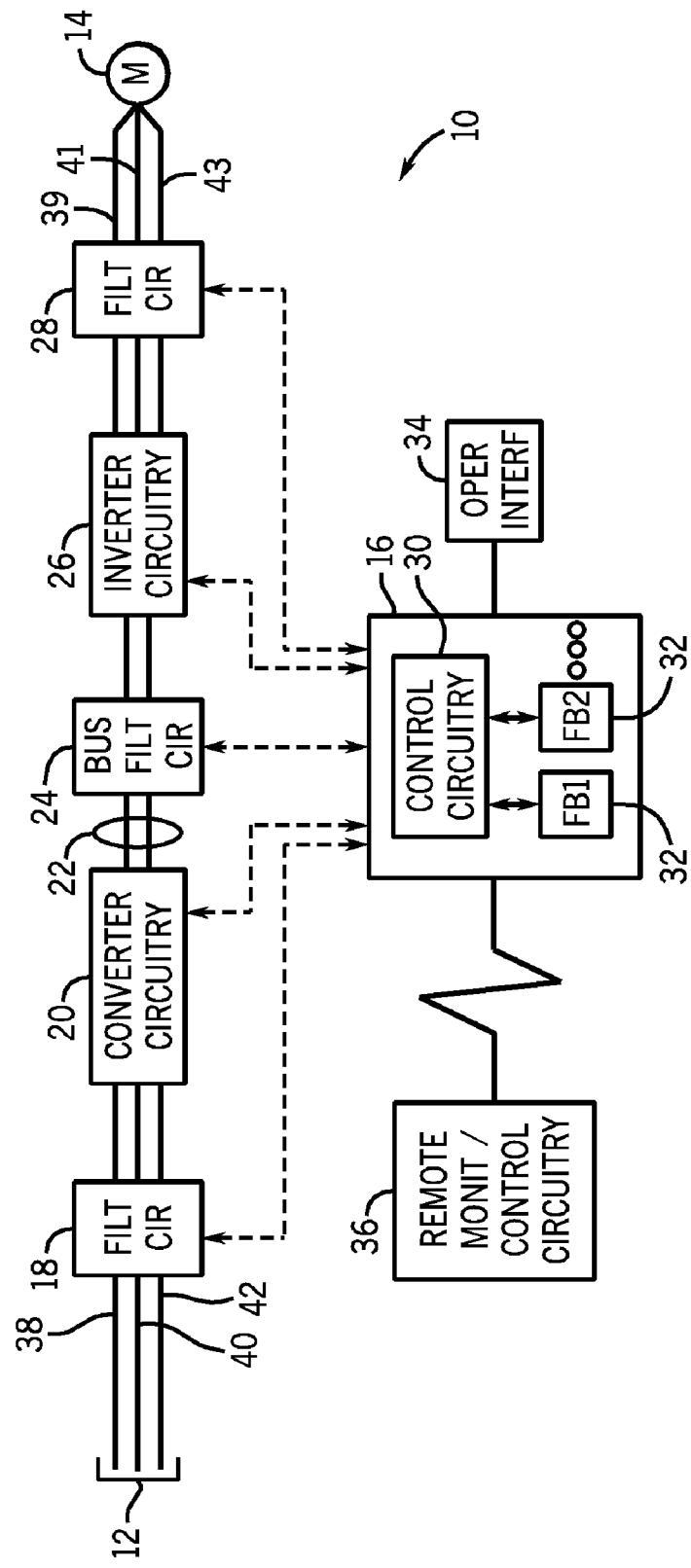
FIG. 1 is a diagrammatical representation of an exemplary embodiment of a motor drive system.

Turning now to the drawings, FIG. 1 represents a motor drive system 10 in accordance with aspects of the present disclosure. The motor drive system 10 is configured to be coupled to a source of AC power, such as the power grid, as indicated by reference numeral 12, and to deliver conditioned power to a motor 14 or any other suitable load. A controller 16 is coupled to the circuitry of the motor drive system 10 and is configured to control operation of the circuitry as described more fully below. In a presently contemplated embodiment, the controller 16 may be housed in the drive or in a separate enclosure. Appropriate cabling (e.g., fiber optic cabling) is provided to communicate control and feedback signals between the controller 16 and the circuitry of the motor drive system 10. In the embodiment illustrated in FIG. 1, power filtration circuitry 18 may be provided upstream of the motor drive. Such circuitry may include inductors, capacitors, circuit breakers, fuses, and so forth, that are generally conventional in design and application. It should be noted that, while the present discussion relates generally to a motor drive system, the system on which the present techniques are employed may comprise various configurations of power conversion circuits, and may be used to power various loads, electric motors being of particular importance, but not the only type of load that may be powered.

The motor drive system 10 may also include converter circuitry 20 that converts the three phases of AC power from the AC power source 12 to DC power that is applied to a DC bus 22. The converter circuitry 20 may be passive or active. That is, in a presently contemplated embodiment, non-switched circuitry alone is used to define a full wave rectifier that converts the incoming AC power to DC power that is applied to the bus 22. In other embodiments, the converter circuitry 20 may be active, including controlled power electronic switches that are switched between conducting and non-conducting states to control the characteristics of the DC power applied to the bus 22. The systems and methods described herein may be particularly beneficial when the converter circuitry 20 is active converter circuitry. In addition, bus filtration/energy storage circuitry 24 may be provided that conditions the DC power conveyed along the DC bus 22. Such filtration circuitry may include, for example, capacitors, inductors (e.g., chokes), braking resistors, and so forth.

The motor drive system 10 also includes inverter circuitry 26. As will be appreciated by those skilled in the art, such circuitry will typically include sets of power electronic switches, such as insulated gate bipolar transistors (IGBTs) and diodes arranged to allow for converting the DC power from the bus 22 to controlled frequency AC output waveforms. The inverters thus create three phases of controlled frequency output, which may be applied to output filtration circuitry 28, which may include electromagnetic components that couple the output power between the phases.

The controller 16 will typically include control circuitry 30 that is configured to implement various control regimes by properly signaling the inverter circuitry 26 (and, where appropriate, the converter circuitry 20) to control the power electronic switches within these circuits. The control circuitry 30 may, for example, include any suitable processor, such as a microprocessor, field programmable gate array (FPGA), memory circuitry, supporting power supplies, and so forth. In motor drive applications, the control circuitry 30 may be configured to implement various desired control regimes, such as for speed regulation, torque control, vector control, start-up regimes, and so forth. In the embodiment illustrated in FIG. 1, various functional circuit boards 32 are linked to the control circuitry 30 and may be provided for specific functions. For example, a wide range of options may be implemented by the use of such circuitry, including the control regimes mentioned above, as well as various communications options, safety options, and so forth.

The controller 16 will typically allow for connection to an operator interface, which may be local at the controller and/or remote from it. In a presently contemplated embodiment, for example, an operator interface 34 may be physically positioned on the controller 16 but removable for hand-held interfacing. The interface circuitry (e.g., portable computers) may also be coupled permanently or occasionally to the controller 16, such as via Internet cabling or other network protocols, including standard industrial control protocols. Finally, the controller 16 may be coupled to various remote monitoring and control circuitry as indicated by reference numeral 36. Such circuitry may include monitoring stations, control stations, control rooms, remote programming stations, and so forth. It should be noted that such circuitry may also include other drives, such that the operation of the motor drive system 10 may be coordinated, where desired, with that of other equipment. Such coordination is particularly useful in automation settings where a large number of operations are performed in a coordinated manner. Thus, the control circuitry 30 may form its control in coordination with logic implemented by automation controllers, separate computers, and so forth.

Currents and voltages for input phases 38, 40, 42 (i.e., the A, B, and C phases, respectively), for output phases 39, 41, 43 (i.e., the U, V and W phases, respectively), and for the DC-link 22 of the motor drive system 10 may be monitored at all points along the motor drive system 10 to control and protect the motor drive system 10. For example, a ground current may be determined by summing the currents for all three phases 39, 41, 43. When the sum of the currents of the three phases 39, 41, 43 exceeds a threshold value (e.g., 20% of the rated current for the motor drive), a ground fault of the motor drive system 10 may be considered to have occurred. Certain methods for detecting ground faults are based on level detection and/or level of fundamental voltage/current signature. However, these methods of ground fault detection are relatively sensitive to topology and asymmetry of the motor drive system 10. Furthermore, setting thresholds for ground faults may be relative difficult with such methods of ground fault detection.

As described in greater detail below, the controller 16 may include a common mode voltage booster module configured to calculate a common mode voltage boost factor and a common mode voltage boost function based on a plurality of voltage commands (i.e., voltage commands relating to voltages of the three phases 39, 41, 43) for the motor drive system 10. The common mode voltage boost factor and/or the common mode voltage boost function may be applied to the voltage commands to generate boosted voltage commands that could source currents indicative of ground faults in the motor drive system 10. More specifically, the common mode voltage boost factor may be multiplied by a common mode voltage that is calculated by a common mode voltage calculator and summed with the voltage commands. In addition, the common mode voltage boost function may be summed with the voltage commands after the voltage commands have been summed with the common mode voltage boost factor. The embodiments described herein provide the ability to detect ground faults in the motor drive system 10 inexpensively by tracking adequate harmonic components of common mode voltage sourced currents. In addition, the embodiments described herein allow for detection of which particular motor drive in a system of parallel motor drives is experiencing a ground fault.

Figure 2:
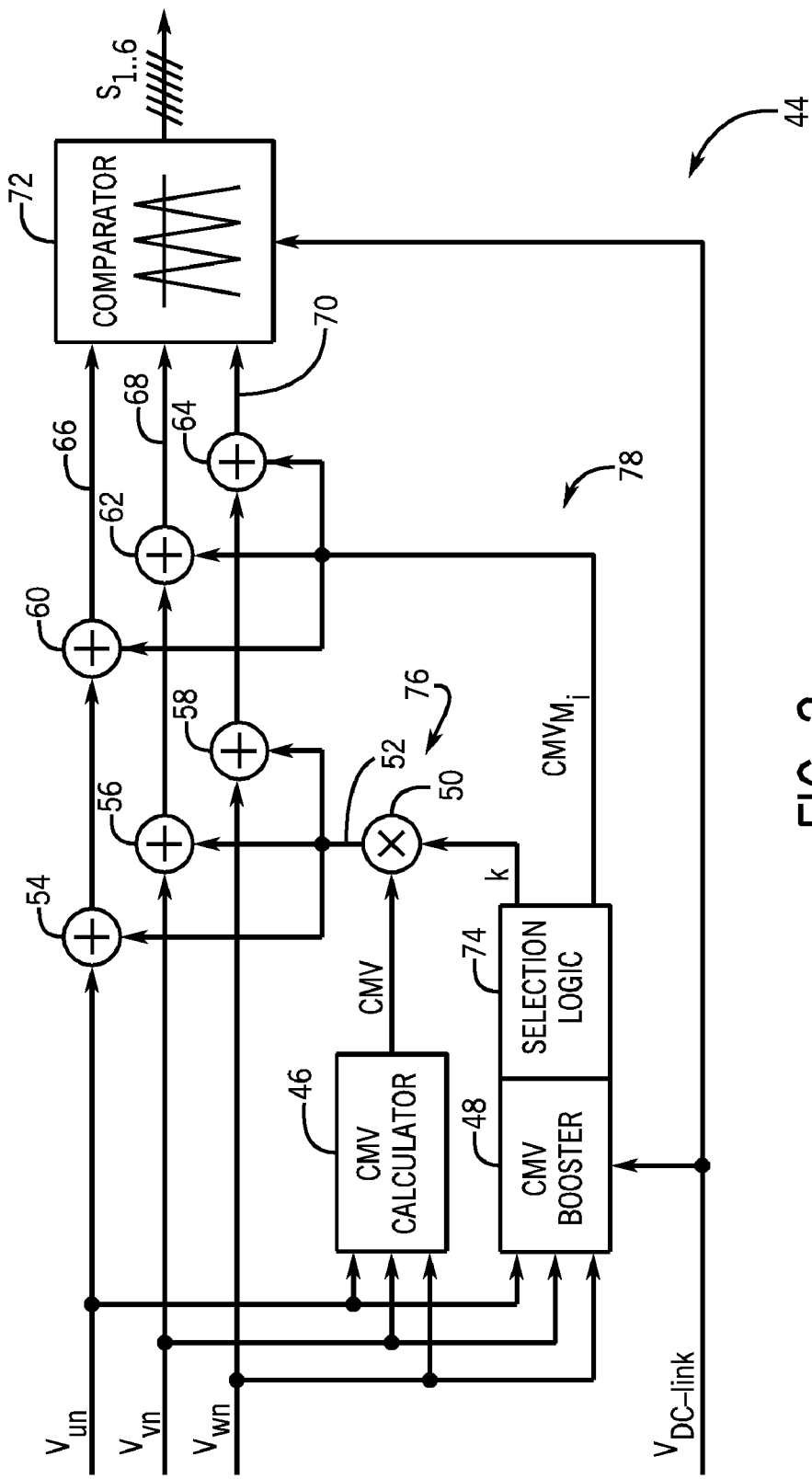
FIG. 2 is a schematic representation of control logic that may be implemented by a controller to detect when ground faults have occurred in the motor drive system of FIG. 1.

FIG. 2 is a schematic representation of control logic 44 that may be implemented by the control circuitry 30 of the controller 16 to detect when ground faults have occurred in the motor drive system 10 of FIG. 1. As will be appreciated, the control circuitry 30 may include a processor configured to execute program instructions (e.g., software) stored in a machine readable storage medium, such as Flash memory, EEPROM, ROM, CD-ROM or other optical data storage media, or any other appropriate storage medium which may store data or instructions for carrying out the techniques discussed below. More specifically, the control circuitry 30 may receive signals (e.g., from sensors) from the motor drive system 10 that relate to operating conditions of the motor drive system 10, such as voltages, currents, and so forth. The signals received by the control circuitry 30 may be used as inputs into the control logic 44, which may be implemented as program instructions executed by the processor of the controller 16 to generate control outputs, as described in greater detail below.

More specifically, as illustrated in FIG. 2, the control logic 44 may receive three voltage command signals $V_{un}$, $V_{vn}$, $V_{wn}$, which are respectively representative of the line voltages for the three phases 39, 41, 43 of the motor drive system 10 of FIG. 1 with respect to the virtual neutral point of the modulator of the inverter circuitry 26. The voltage commands $V_{un}$, $V_{vn}$, $V_{wn}$, may be received by the control logic 44 from any location along the motor drive system 10 where the three phases 39, 41, 43 of AC power exist. For example, the voltage commands $V_{un}$, $V_{vn}$, $V_{wn}$ may be representative of the inverter output voltages for the three phases 39, 41, 43 between the inverter circuitry 26 and the power filtration circuitry 28, or between the power filtration circuitry 28 and the motor 14. Similarly, in situations where the rectifier is active, voltages commands $V_{an}$, $V_{bn}$, $V_{cn}$, which are representative of the line voltages for the three phases 38, 40, 42 of the motor drive system 10 of FIG. 1 with respect to the virtual neutral point of the modulator of the converter circuitry 20, may be received by the control logic 44 from any location along the motor drive system 10 where the three phases 38, 40, 42 of AC power exist. For example, the voltage commands $V_{an}$, $V_{bn}$, $V_{cn}$ may be representative of the line voltages for the three phases 38, 40, 42 between the AC power source 12 and the power filtration circuitry 18, or between the power filtration circuitry 18 and the converter circuitry 20. The control logic 44 may also receive a signal representative of the DC-link voltage $V_{DC-link}$, which may be received from anywhere along the motor drive system 10 between the converter circuitry 20 and the inverter circuitry 26 where DC power exists.

As illustrated in FIG. 2, the control logic 44 includes a common mode voltage calculator module 46 configured to calculate the common mode voltage CMV (i.e., a common mode signature) of the motor drive system 10 based on the three voltage commands $V_{un}$, $V_{vn}$, $V_{wn}$. In general, the common mode voltage CMV of the motor drive system 10 is representative of a voltage measured between a neutral point in the motor drive system 10 and an electrical ground. The current sourced by the common mode voltage CMV may be used to detect ground faults that occur over time in the motor drive system 10. However, using the current sourced by the common mode voltage CMV alone as a measure of ground faults may become somewhat difficult at higher inverter operating frequencies (e.g., 40 Hz or higher), as the injection of CMV drops.

As such, the embodiments described herein also utilize a common mode voltage booster module 48, which may be used to calculate a common mode voltage boost factor k and a common mode voltage boost function $CMV_{Mi}$ using the voltage commands $V_{un}$, $V_{vn}$, $V_{wn}$ and the DC-link voltage $V_{DC-link}$ as inputs. In certain embodiments, the common mode voltage boost factor k may be a function of the operating frequency of the inverter circuitry 26 of the motor drive system 10. As illustrated in FIG. 2, the common mode voltage boost factor k may be used to boost (i.e., increase) the common mode voltage CMV signal calculated by the common mode voltage calculator module 46, such that the boosted common mode voltage CMV signal may be added to the voltage commands $V_{un}$, $V_{vn}$, $V_{wn}$ for generation of switch control signals $S_1$, $S_2$, $S_3$, $S_4$, $S_5$, $S_6$, which may be used to control the switching of the power electronic switches of the inverter circuitry 26 of the motor drive system 10.

As illustrated in FIG. 2, the common mode voltage boost factor k may be multiplied by the common mode voltage CMV of the inverter circuitry 26 using a multiplier 50 (i.e., multiplication circuitry for multiplying the common mode voltage boost factor k by the common mode voltage CMV signal). The boosted common mode voltage signal 52 from the multiplier 50 (i.e., the product of the multiplier 50) may then be added to each of the voltage commands $V_{un}$, $V_{vn}$, $V_{wn}$ using a first series of adders 54, 56, 58 (i.e., addition circuitry for adding the boosted common mode voltage signal 52 to the voltage commands $V_{un}$, $V_{vn}$, $V_{wn}$). For example, the boosted common mode voltage signal 52 from the multiplier 50 may be added to the voltage command $V_{un}$ using a first adder 54, the boosted common mode voltage signal 52 from the multiplier 50 may be added to the voltage command $V_{vn}$ using a second adder 56, and the boosted common mode voltage signal 52 from the multiplier 50 may be added to the voltage command $V_{wn}$ using a third adder 58.

As also illustrated in FIG. 2, the common mode voltage boost function $CMV_{Mi}$ may be added to the voltage commands $V_{un}$, $V_{vn}$, $V_{wn}$, in addition to the boosted common mode voltage signal 52, for generation of the switch control signals $S_1$, $S_2$, $S_3$, $S_4$, $S_5$, $S_6$. More specifically, the common mode voltage boost function $CMV_{Mi}$ may be added to each of the voltage commands $V_{un}$, $V_{vn}$, $V_{wn}$ using a second series of adders 60, 62, 64 (i.e., addition circuitry for adding the common mode voltage boost function $CMV_{Mi}$ to the voltage commands $V_{un}$, $V_{vn}$, $V_{wn}$). For example, the common mode voltage boost function $CMV_{Mi}$ may be added to the voltage command $V_{un}$ using a first adder 60, the common mode voltage boost function $CMV_{Mi}$ may be added to the voltage command $V_{vn}$ using a second adder 62, and the common mode voltage boost function $CMV_{Mi}$ may be added to the voltage command $V_{wn}$ using a third adder 64.

Once the boosted common mode voltage signal 52 from the multiplier 50 has been added to each of the voltage commands $V_{un}$, $V_{vn}$, $V_{wn}$ using the first series of adders 54, 56, 58 and the common mode voltage boost function $CMV_{Mi}$ has been added to each of the voltage commands $V_{un}$, $V_{vn}$, $V_{wn}$ using the second series of adders 60, 62, 64, the resulting boosted voltage commands 66, 68, 70 (i.e., which respectively correspond to the input voltage commands $V_{un}$, $V_{vn}$, $V_{wn}$) may be used as inputs into a comparator 72 (i.e., comparator circuitry). The comparator 72 may use the boosted voltage commands 66, 68, 70 (as well as the DC-link voltage $V_{DC-link}$) as inputs to generate the switch control signals $S_1$, $S_2$, $S_3$, $S_4$, $S_5$, $S_6$, which the controller 16 may use to control the switching of the power electronic switches of the inverter circuitry 26 of the motor drive system 10.

Although illustrated in FIG. 2 as using both the common mode voltage boost factor k and the common mode voltage boost function $CMV_{Mi}$ to generate the boosted voltage commands 66, 68, 70, in certain situations, the control logic 44 may determine that only one or the other of the common mode voltage boost factor k and the common mode voltage boost function $CMV_{Mi}$ should be used to boost the signals relating to the voltage commands $V_{un}$, $V_{vn}$, $V_{wn}$. As such, in certain embodiments, the control logic 44 may also include a selection logic module 74, which may be used to determine whether the common mode voltage boost factor k and/or the common mode voltage boost function $CMV_{Mi}$ should be used to boost the signals relating to the voltage commands $V_{un}$, $V_{vn}$, $V_{wn}$. For example, in certain circumstances, if the drive speed or frequency of the motor drive system 10 is below a desired threshold frequency (e.g., 40 Hz), the selection logic module 74 may determine that only the common mode voltage boost factor k should be added to the voltage commands $V_{un}$, $V_{vn}$, $V_{wn}$. Conversely, if the drive speed or frequency of the motor drive system 10 is above the desired threshold frequency, the selection logic module 74 may determine that only the common mode voltage boost function $CMV_{Mi}$ should be added to the voltage commands $V_{un}$, $V_{vn}$, $V_{wn}$. In situations where it is determined that only the common mode voltage boost factor k should be used, the common mode voltage boost function $CMV_{Mi}$ may be set to zero by the selection logic module 74. Conversely, in situations where it is determined that only the common mode voltage boost function $CMV_{Mi}$ should be used, the common mode voltage boost factor k may be set to zero by the selection logic module 74. In certain embodiments, the switching between the common mode voltage boost factor k and the common mode voltage boost function $CMV_{Mi}$ may be determined by the selection logic module 74 based on a modulation index (e.g., instead of basing the determination on drive speed or frequency).

Figure 3:
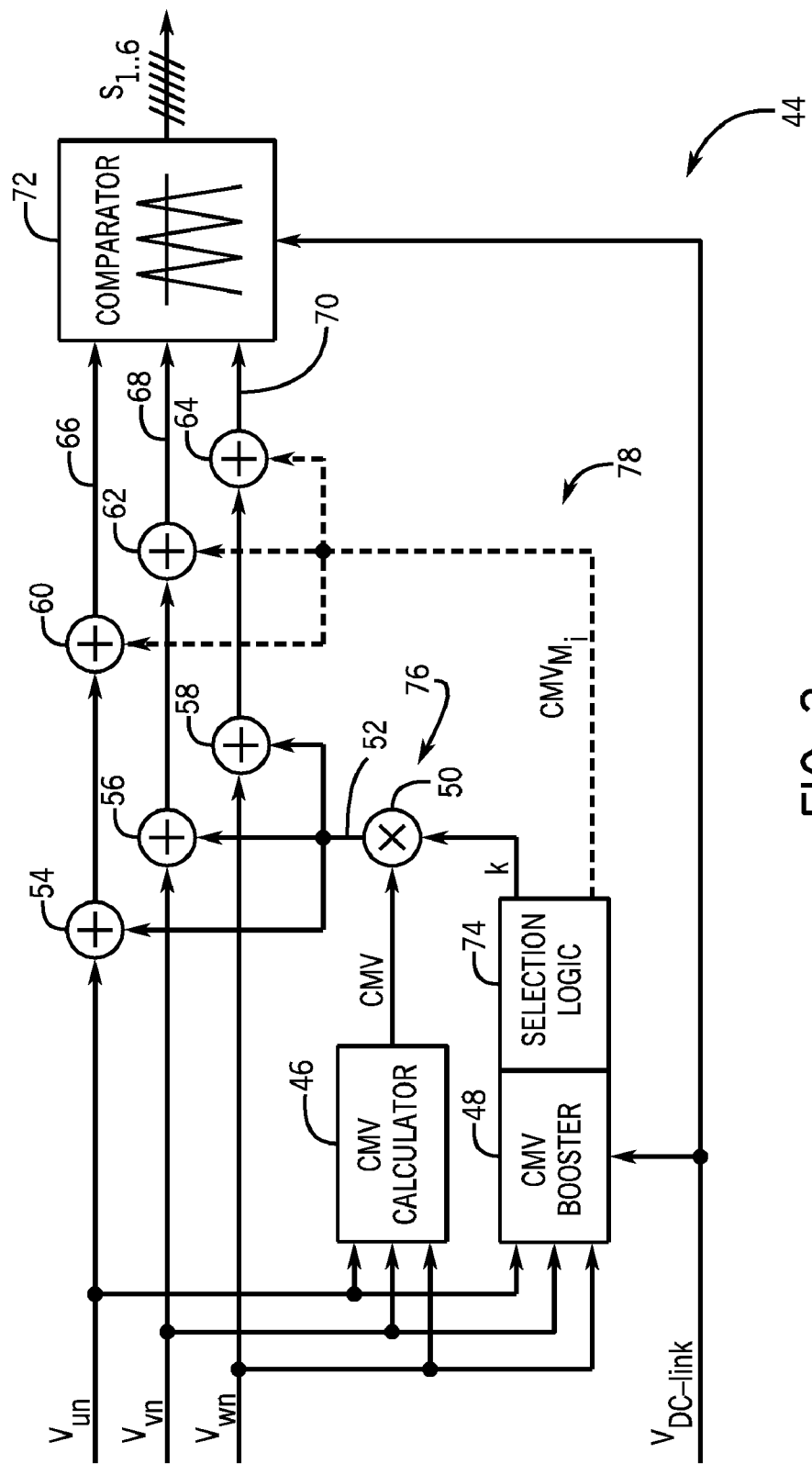
FIG. 3 is a schematic representation of the control logic of FIG. 2 wherein a common mode voltage boost function has been set to zero.
Figure 4:
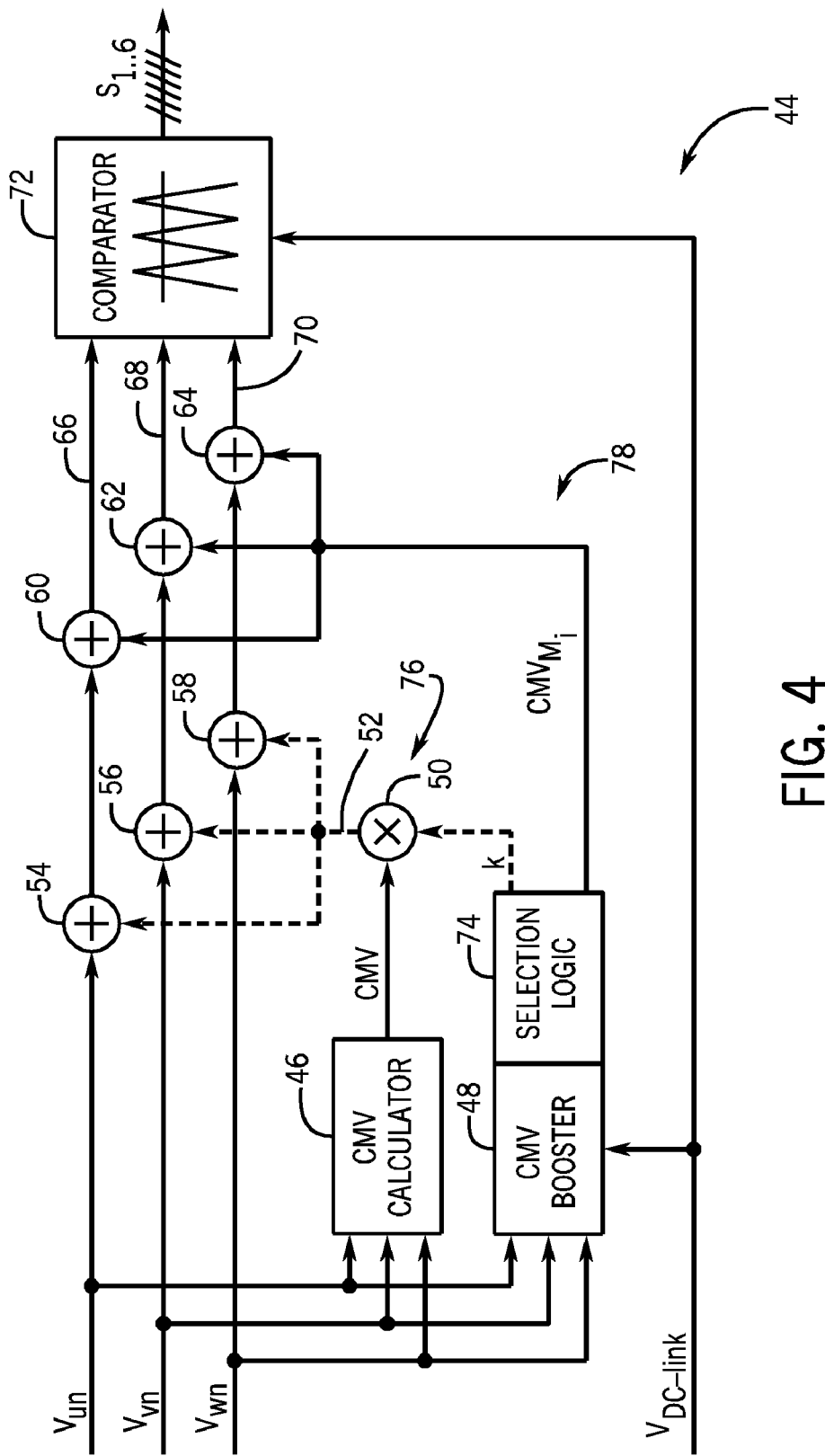
FIG. 4 is a schematic representation of the control logic of FIG. 2 wherein a common mode voltage boost factor has been set to zero.

As such, the control logic 44 may effectively bypass either the common mode voltage boost factor logic path 76 or the common mode voltage boost function logic path 78 based on determinations by the selection logic module 74. For example, FIG. 3 is a schematic representation of the control logic 44 of FIG. 2 wherein the common mode voltage boost function $CMV_{Mi}$ has been set to zero, and FIG. 4 is a schematic representation of the control logic 44 of FIG. 2 wherein the common mode voltage boost factor k has been set to zero. As such, FIG. 3 illustrates the situation where the selection logic module 74 has determined that the common mode voltage boost function $CMV_{Mi}$ should be bypassed, and FIG. 4 illustrates the situation where the selection logic module 74 has determined that the common mode voltage boost factor k should be bypassed. It should also be noted that, in certain embodiments, the selection logic module 74 may be bypassed or omitted entirely, with both the common mode voltage boost factor k and the common mode voltage boost function $CMV_{Mi}$ being used to create the boosted voltage commands 66, 68, 70.

As described above, the current sourced by the boosted voltage commands 66, 68, 70, once applied to the inverter circuitry 26, may be indicative of ground faults occurring in the motor drive systems. As such, the controller 16 may use the boosted voltage commands 66, 68, 70 to detect ground faults occurring in the motor drive system 10. More specifically, the boosting of the voltage commands $V_{un}$, $V_{vn}$, $V_{wn}$ using the common mode voltage boost factor k and/or the common mode voltage boost function $CMV_{Mi}$ generates waveforms (e.g., the boosted voltage commands 66, 68, 70) that have higher amplitudes than the input voltage commands $V_{un}, V_{vn}, V_{wn}$. As such, the boosted voltage commands 66, 68, 70 may be used by the controller 16 to more easily identify when ground faults are occurring in the motor drive system 10. For example, the controller 16 may use frequency spectrum analysis, such as analysis of pulse width modulation (PWM) frequency components, low frequency (e.g., third harmonic of a fundamental frequency) components, and so forth, to detect ground faults in the motor drive system 10.

The selection of a low-frequency current signature for use in detecting ground faults is appropriate to avoid dealing with current "leaking" to ground at higher frequencies through stray capacitances, for instance. More specifically, the smaller current leaking to ground at lower frequencies makes it easier to select a threshold. Candidate components for use in detecting ground faults using the techniques described above include, for example, fundamental frequencies of the motor drive system 10, and a low-frequency common mode for the motor drive system 10. Another advantage of using the low-frequency common mode voltage (CMV) is that the low-frequency CMV is significantly less affected by asymmetric magnetic coupling or by the topology of the motor drive system 10. Conversely, current sourced by differential voltage sources is affected by topology and asymmetry. However, current sourced by differential voltage sources can be used if magnetic coupling in the motor drive system 10 has been verified not to hide the occurrence of a line-to-ground fault, and if comparison of the largest line current magnitude is not required.

As described above, the embodiments described herein monitor low-frequency CMV-sourced currents, such as the CMV-sourced current of the converter circuitry 20, the CMV-sourced current of the inverter circuitry 26, and so forth. In particular, certain embodiments include using the sum of the currents near the AC power source 12 (e.g., between the AC power source 12 and the converter circuitry 20), using the sum of the current near the inverter circuitry 26 (e.g., between the inverter circuitry 26 and the motor 14), using the sum of the current at the DC bus 22, using line currents near the AC power source 12 (e.g., between the AC power source 12 and the converter circuitry 20), using line currents near the inverter circuitry 26 (e.g., between the inverter circuitry 26 and the motor 14), using the rail current at the DC bus 22, and so forth. The calculated value of the common mode voltage boost factor k and/or the common mode voltage boost function $CMV_{Mi}$ ensures that the modulator continues operating within its linear region. In certain embodiments, other criteria may be used to determine and possibly optimize the value of the boost factor k and/or the common mode voltage boost function $CMV_{Mi}$, such as minimum switching losses, for example.

If the topology and asymmetry of the motor drive system 10 can be verified (e.g., through finite element simulation, direct measurement, and so forth) not to be hiding the occurrence of a line-to-ground fault, and the frequency of the inverter circuitry 26 is sufficiently high, the inverter-sourced fundamental may be monitored (e.g., the sum of the currents at the inverter circuitry 26 or each line current for the three phases 38, 40, 42 at the inverter circuitry 26). Otherwise, the low-frequency CMV-sourced current may be monitored. For low-speed ranges, the CMV-sourced current of the converter circuitry 20 or a boosted CMV-sourced current of the inverter circuitry 26 may also be monitored.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A machine readable medium having software instructions encoded thereon, the software instructions comprising:
    a common mode voltage calculator module configured to calculate a common mode voltage of a power conversion system based on a plurality of voltage commands for the system;
    a common mode voltage booster module configured to calculate a common mode voltage boost factor and a common mode voltage boost function based on the plurality of voltage commands for the system;
    a selection logic module configured to determine whether the common mode voltage boost factor and the common mode voltage boost function should be applied to the plurality of voltage commands; and
    at least one adder configured to generate boosted voltage commands based on the common mode voltage and the common mode voltage boost factor and/or the common mode voltage boost function.

2. The machine readable medium of claim 1, wherein the boosted voltage commands are indicative of ground faults occurring in the system, and wherein the system comprises active converter circuitry.

3. The machine readable medium of claim 1, comprising a multiplier for multiplying the common mode voltage calculated by the common mode voltage calculator module with the common mode voltage boost factor calculated by the common mode voltage booster module, a first set of adders for summing the voltage commands with the product of the multiplier, and a second set of adders for summing the voltage commands with the common mode voltage boost function calculated by the common mode voltage booster module.

4. The machine readable medium of claim 3, wherein if the selection logic module determines that the common mode voltage boost factor should not be applied to the common mode voltage, the common mode voltage boost factor is set to zero by the selection logic module.

5. The machine readable medium of claim 3, wherein if the selection logic module determines that the common mode voltage boost function should not be applied to the common mode voltage, the common mode voltage boost function is set to zero by the selection logic module.

6. The machine readable medium of claim 1, wherein the selection logic module is configured to determine whether the common mode voltage boost factor and the common mode voltage boost function should be applied to the common mode voltage based on a frequency of the system.

7. The machine readable medium of claim 1, wherein the selection logic module is configured to determine whether the common mode voltage boost factor and the common mode voltage boost function should be applied to the common mode voltage based on a modulation index of the system.

8. The machine readable medium of claim 1, wherein the common mode voltage boost factor comprises a variable gain.

9. The machine readable medium of claim 1, wherein the common mode voltage boost factor comprises a space vector.

10. A method, comprising:
    calculating a common mode voltage of a motor drive system based on a plurality of voltage commands for the motor drive system;

calculating a common mode voltage boost factor and a common mode voltage boost function based on the plurality of voltage commands for the motor drive system;

determining whether the common mode voltage boost factor and the common mode voltage boost function should be applied to the plurality of voltage commands; and generating boosted voltage commands based on the common mode voltage and the common mode voltage boost factor and/or the common mode voltage boost function.

11. The method of claim 10, comprising determining whether a ground fault has occurred in the motor drive system based on the boosted voltage commands, wherein the motor drive system comprises active converter circuitry.

12. The method of claim 10, comprising multiplying the common mode voltage with the common mode voltage boost factor, summing the voltage commands with the product of the common mode voltage and the common mode voltage boost factor, and summing the voltage commands with the common mode voltage boost function.

13. The method of claim 12, comprising setting the common mode voltage boost factor to zero if it is determined that the common mode voltage boost factor should not be applied to the common mode voltage.

14. The method of claim 12, comprising setting the common mode voltage boost function to zero if it is determined that the common mode voltage boost function should not be applied to the common mode voltage.

15. The method of claim 10, comprising determining whether the common mode voltage boost factor and the common mode voltage boost function should be applied to the common mode voltage based on a frequency of the motor drive system.

16. The method of claim 10, comprising determining whether the common mode voltage boost factor and the common mode voltage boost function should be applied to the common mode voltage based on a modulation index of the motor drive system.

17. The method of claim 10, comprising calculating the common mode voltage boost factor as a variable gain.

18. A motor drive system, comprising:
converter circuitry configured to receive input three-phase alternating current (AC) power from an AC power source and convert the three-phase AC power into direct current (DC) power:
a DC bus configured to receive the DC power from the converter circuitry;
inverter circuitry configured to receive the DC power from the DC bus and convert it into controlled frequency output AC power for use by a three-phase motor; and
a controller, comprising a common mode voltage calculator module configured to calculate a common mode voltage of the motor drive system based on a plurality of voltage commands for the motor drive system, a common mode voltage booster module configured to calculate a common mode voltage boost factor and a common mode voltage boost function based on the plurality of voltage commands for the motor drive system, a selection logic module configured to determine whether the common mode voltage boost factor and the common mode voltage boost function should be applied to the plurality of voltage commands, and a set of adders configured to generate boosted voltage commands based on the common mode voltage and the common mode voltage boost factor and/or the common mode voltage boost function.

19. The system of claim 18, wherein a current sourced by the boosted voltage commands, when applied to the inverter circuitry, are indicative of ground faults occurring in the motor drive system.

20. The system of claim 18, wherein the converter circuitry is active converter circuitry.

21. A method, comprising:
calculating a common mode voltage of a power conversion system based on a plurality of voltage commands for the system;
calculating a common mode voltage boost factor and a common mode voltage boost function based on the plurality of voltage commands for the system; and
generating boosted voltage commands based on the common mode voltage and the common mode voltage boost factor and/or the common mode voltage boost function.

22. The method of claim 21, comprising determining whether the common mode voltage boost factor and the common mode voltage boost function should be applied to the plurality of voltage commands.

23. The method of claim 21, comprising determining whether a ground fault has occurred in the system based on the boosted voltage commands, wherein the system comprises active converter circuitry.

* * * * *